(12) United States Patent
Okuno et al.

(10) Patent No.: US 7,763,893 B2
(45) Date of Patent: Jul. 27, 2010

(54) SILICON CARBIDE SEMICONDUCTOR DEVICE

(75) Inventors: Eiichi Okuno, Mizuho (JP); Toshio Sakakibara, Nishio (JP)

(73) Assignee: DENSO Corporation, Kariya (JP)

( * ) Notice: Subject to any disclaimer, the term of this patent is extended or adjusted under 35 U.S.C. 154(b) by 326 days.

(21) Appl. No.: 11/979,753

(22) Filed: Nov. 8, 2007

(65) Prior Publication Data
US 2008/0128711 A1 Jun. 5, 2008

Related U.S. Application Data (62) Division of application No. 11/396,715, filed on Apr. 4, 2006, now Pat. No. 7,470,930.

(30) Foreign Application Priority Data

Apr. 19, 2005 (JP) .............................. 2005-120950

(51) Int. Cl.
*H01L 31/0312* (2006.01)
(52) U.S. Cl. .......................... 257/77; 257/330; 257/341; 257/343; 257/E29.104; 257/E29.257; 257/E29.258; 257/E29.26; 257/E29.338
(58) Field of Classification Search .................... 257/77, 257/330, 331, 341, 343, E29.104, E29.257, 257/E29.258, E29.26, E29.338
See application file for complete search history.

(56) References Cited

U.S. PATENT DOCUMENTS

| | | | |
|---|---|---|---|
| 6,002,143 A * | 12/1999 | Terasawa | 257/77 |
| 6,218,254 B1 | 4/2001 | Singh et al. | |
| 6,736,894 B2 | 5/2004 | Kawahara et al. | |
| 2002/0014640 A1 | 2/2002 | Mitlehner et al. | |
| 2004/0084721 A1 | 5/2004 | Kocon et al. | |
| 2004/0089910 A1 | 5/2004 | Hirler et al. | |

FOREIGN PATENT DOCUMENTS

| | | |
|---|---|---|
| JP | B2-2612040 | 1/1990 |
| JP | A-6-326064 | 11/1994 |
| JP | A-10-308511 | 11/1998 |
| JP | B2-3385938 | 1/2003 |

OTHER PUBLICATIONS

Office Action dated Jan. 9, 2008 in corresponding U.S. Appl. No. 11/396,715.
Office Action dated Jun. 19, 2008 in corresponding U.S. Appl. No. 11/396,715.

* cited by examiner

*Primary Examiner*—Minh-Loan T Tran
(74) *Attorney, Agent, or Firm*—Posz Law Group, PLC (57) ABSTRACT

A silicon carbide semiconductor device includes a semiconductor element disposed in a semiconductor substrate having a first conductive type silicon carbide layer and a silicon substrate. The device includes: a trench on the silicon carbide layer to reach the silicon substrate; and a conductive layer in the trench between the silicon carbide layer and the silicon substrate to connect to both of them. The semiconductor element is a vertical type semiconductor element so that current flows on both of a top surface portion and a backside surface portion of the semiconductor substrate. The current flows through the conductive layer.

9 Claims, 6 Drawing Sheets

SILICON CARBIDE SEMICONDUCTOR DEVICE

CROSS REFERENCE TO RELATED APPLICATION

This application is a division of application Ser. No. 11/396,715 filed on Apr. 4, 2006, which is based on Japanese Patent Application No. 2005-120950 filed on Apr. 19, 2005, the disclosure of which is incorporated herein by reference.

FIELD OF THE INVENTION

The present invention relates to a silicon carbide semiconductor device.

BACKGROUND OF THE INVENTION

SiC does not become a liquid phase under a normal pressure, which is different from Si. Therefore, a SiC substrate cannot be manufactured by using a pulling method, which is used for forming a Si substrate. There is an attempt to perform SiC substrate growth by a sublimation re-crystallization method for changing a solid phase to a gas phase directly. However, in this case, enormous inventive approach is necessary for forming the SiC substrate with high quality and large diameter.

Regarding the above point, it is reported that 3C—SiC (or β-SiC) material having a cubic crystal can be grown on a {111}-surface of the Si substrate. For example, it is disclosed in Japanese Patent Application Publication No. 2003-68654. Specifically, a groove, i.e., an undulation, along with one direction is formed on the Si substrate. A SiC material is grown on a surface having a relief caused by the groove, so that the SiC crystal having low surface defect density is obtained.

The Japanese Patent Application Publication No. 2003-68654 discloses that the SiC material is epitaxially grown on the Si substrate. Therefore, a diameter of the substrate depends on the Si substrate, so that it is considered that a diameter of the SiC substrate can become large.

However, when a semiconductor substrate (i.e., a 3C—SiC/Si substrate) having a 3C—SiC layer formed on a Si substrate is used for manufacturing a power device, a band offset exists at the interface between the 3C—SiC layer and the Si substrate. Thus, a voltage drop of a few volts is generated. Therefore, a problem arises that the manufactured power device includes a few voltage drop.

SUMMARY OF THE INVENTION

In view of the above-described problem, it is an object of the present invention to provide a SiC semiconductor device having no voltage drop of a band offset between a Si substrate and a SiC layer without removing the Si substrate, i.e., without adding a step of removing the Si substrate.

A silicon carbide semiconductor device includes a semiconductor element. The semiconductor element is disposed in a semiconductor substrate having a first conductive type silicon carbide layer and a silicon substrate. The first conductive type silicon carbide layer is disposed on a principal surface of the silicon substrate. The device includes: a trench disposed on a surface of the silicon carbide layer to reach the silicon substrate; and a conductive layer disposed in the trench at a boundary portion between the silicon carbide layer and the silicon substrate to connect to both of the silicon carbide layer and the silicon substrate. The semiconductor element is a vertical type semiconductor element so that current flows on both of a top surface portion and a backside surface portion of the semiconductor substrate. The current flows through the conductive layer.

Thus, the conductive layer is arranged between the silicon carbide layer and the silicon substrate, so that a band offset is eliminated substantially. Thus, the semiconductor substrate, in which the silicon substrate is not removed from the silicon carbide layer, is used for the silicon carbide semiconductor device without generating the voltage drop of the band offset between the silicon substrate and the silicon carbide layer. The SiC semiconductor device having no voltage drop of the band offset between the Si substrate and the SiC layer without removing the Si substrate is provided.

Further, a silicon carbide semiconductor device includes a semiconductor element. The semiconductor element is disposed in a semiconductor substrate having a first conductive type silicon carbide layer and a silicon substrate. The first conductive type silicon carbide layer is disposed on a principal surface of the silicon substrate. The device includes: a trench disposed on a backside surface of the silicon substrate to reach the silicon carbide layer; and a backside electrode disposed in the trench at a boundary portion between the silicon carbide layer and the silicon substrate to connect to both of the silicon carbide layer and the silicon substrate. The semiconductor element is a vertical type semiconductor element so that current flows on both of a foreside surface portion and a backside surface portion of the semiconductor substrate. The current flows through the backside electrode.

Thus, even when the trench is formed on the backside surface of the silicon substrate to reach the silicon carbide layer, and the backside electrode is formed in the trench, the device can attain the following effects. Specifically, the backside electrode is arranged between the silicon carbide layer and the silicon substrate, so that a band offset is eliminated substantially. Thus, the semiconductor substrate, in which the silicon substrate is not removed from the silicon carbide layer, is used for the silicon carbide semiconductor device without generating the voltage drop of the band offset between the silicon substrate and the silicon carbide layer. The SiC semiconductor device having no voltage drop of the band offset between the Si substrate and the SiC layer without removing the Si substrate is provided.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
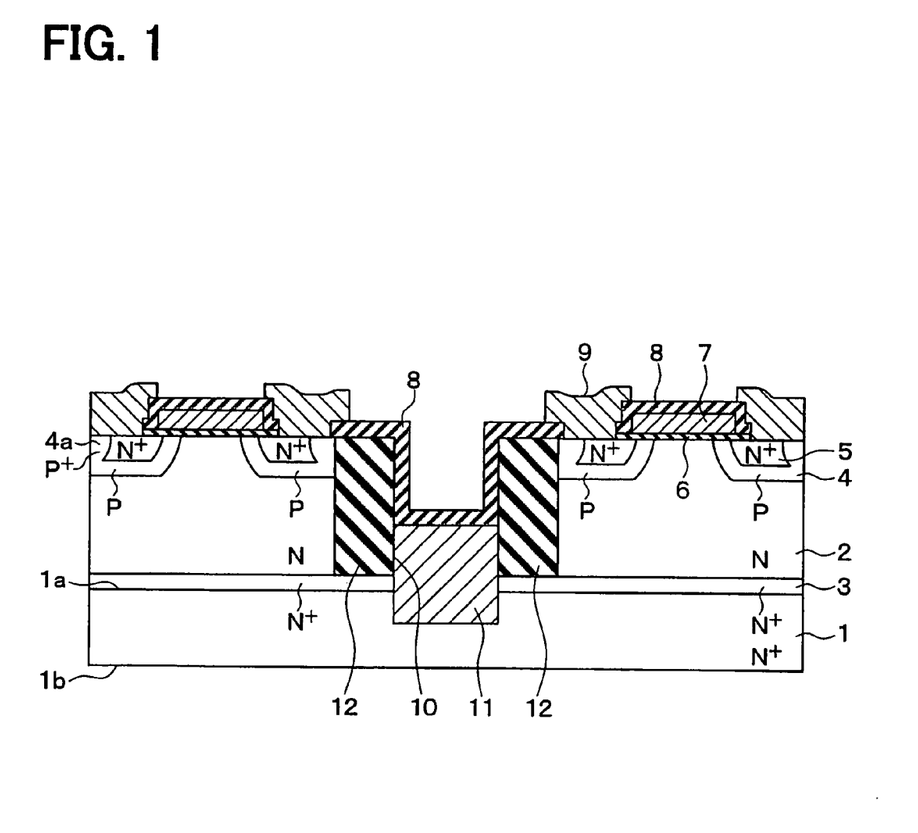
FIG. 1 is a cross sectional view showing a SiC semiconductor device having a N channel planar type vertical power MOSFET according to a first embodiment of the present invention.

FIG. 1 is a cross sectional view showing a SiC semiconductor device having a planar type MOSFET (i.e., a vertical type power MOSFET), which is a N channel type MOSFET.

As shown in FIG. 1, a semiconductor substrate having a following construction is used. The construction is such that a N type SiC layer 2 and a $N^+$ type low resistance layer 3 are formed on a $N^+$ type Si substrate 1; and the $N^+$ type low resistance layer 3 is arranged between the $N^+$ type Si substrate 1 and the N type SiC layer 2.

The $N^+$ type Si substrate 1 has a thickness of, for example, 100 μm to a few hundreds μm. The $N^+$ type Si substrate 1 has N type impurity concentration of, for example, about $10^{19}$ $cm^{-3}$. The $N^+$ type Si substrate 1 has a top surface as a principal surface 1a and a bottom surface as a backside surface 1b, which is opposite to the principal surface. The principal surface 1a is, for example, a {111}-surface. The N type SiC layer 2 has a thickness of, for example, 10 μm, and a N type impurity concentration of, for example, about $10^{16}$ $cm^{-3}$. The $N^+$ type low resistance layer 3 has a N type impurity concentration in a range between $1 \times 10^{19}$ $cm^{-3}$ and $1 \times 10^{20}$ $cm^{-3}$ so that a resistance of the $N^+$ type low resistance layer 3 becomes sufficiently lower than a resistance of the N type SiC layer 2. Here, the thickness of the N type low resistance layer 3 is not defined specifically. However, it is more preferable that the thickness of the N type low resistance layer 3 becomes thicker.

Multiple P type base regions 4 are formed on a predetermined region of a surface portion of the N type SiC layer 2. The P type base regions 4 having a predetermined depth are separated together. A $N^+$ type source region 5 is formed on a predetermined region of a surface portion of each P type base region 4. The $N^+$ type source region 5 is shallower than the P type base region 4.

A gate oxide film 6 (i.e., a gate insulation film) is formed at least to cover a channel region. The channel region is a region of the surface portion of the P type base region 4 sandwiched between the $N^+$ type source region 5 and the N type SiC layer 2. In this embodiment, the gate oxide film 6 is formed on the surface of the N type SiC layer 2 and the channel region in order to connect between neighboring two $N^+$ type source regions 5, which are separately arranged. A gate electrode 7 is formed on the surface of the gate oxide film 6. The gate electrode 7 is made of doped poly-silicon or the like.

An interlayer insulation film 8 is formed to cover the gate electrode 7. A source electrode 9 is electrically connected to the $N^+$ type source region 5 through a contact hole formed in the interlayer insulation film 8. The source electrode 9 is also connected to the P type base region 4 at a contact region 4a so that the electric potential of the P type base region 4 is fixed.

The vertical type power MOSFET having the above construction provides one cell. Multiple cells are formed on the semiconductor substrate.

In this embodiment, a trench 10 is formed between two vertical type power MOSFETS such that the trench 10 penetrates the N type SiC layer 2 and the $N^+$ type low resistance layer 3, and reaches the $N^+$ type Si substrate 1. A conductive layer 11 is disposed in the trench 10. Further, an insulation film 12 composes the sidewall of the trench 10 in the N type SiC layer 2.

The conductive layer 11 is made of, for example, metal so that the conductive layer 11 contacts the $N^+$ type low resistance layer 3 with ohmic contact, and that the conductive layer 11 contacts the $N^+$ type Si substrate 1 with ohmic contact. The $N^+$ type low resistance layer 3 is made of SiC. For example, the conductive layer 11 is made of, for example, aluminum, nickel, copper, or a titanium-nickel-gold multi-layer film. Alternatively, the conductive layer 11 is made of different material in each part of the conductive layer 11. For example, a part of the conductive layer 11 disposed on the surface of the $N^+$ type Si substrate 1 is made of aluminum, and another part of the conductive layer 11 disposed on the surface of the $N^+$ type low resistance layer 3 is made of nickel.

The insulation film 12 is made of, for example, $SiO_2$. The insulation film 12 functions to insulate and separate between the conductive layer 11 and the N type SiC layer 2. In this embodiment, the interlayer insulation film 8 extends to be disposed on the surface of the insulation film 12 and the surface of the conductive layer 11. The interlayer insulation film 8 isolates and separates between the conductive layer 11 and the source electrode 9.

Thus, the SiC semiconductor device having the vertical type power MOSFET according to this embodiment is constructed.

In the SiC semiconductor device having the above construction, the vertical type power MOSFET functions as an inversion type device having the $N^+$ type low resistance layer 3 and the $N^+$ type Si substrate 1 as a drain. Specifically, when a predetermined voltage is not applied to the gate electrode 7, the channel region is not provided on the surface of the P type base region 4. Thus, no current flows between the source and the drain. When the predetermined voltage is applied to the gate electrode 7, the channel region is provided on the surface of the P type base region 4. Thus, the current flows between the source and the drain.

Thus, when the current flows, an electron passes through the $N^+$ type source region 5, the channel region, and the N type SiC layer 2, and then, the electron flows into the $N^+$ type low resistance layer 3. In this case, since the $N^+$ type low resistance layer 3 has a low resistance, the electron flows in a lateral direction (i.e., a horizontal direction of the substrate). Then, the electron flows into the $N^+$ type Si substrate 1 through the conductive layer 11. Therefore, the current can flow between the source and the drain without exceeding a band offset between the $N^+$ type low resistance layer 3, which is made of SiC, and the $N^+$ type Si substrate 1. Specifically, the conductive layer 11 made of metal is disposed between the $N^+$ type low resistance layer 3, which are made of SiC, and the $N^+$ type Si substrate 1. Thus, it is possible that the band offset is practically disappeared.

Thus, the semiconductor substrate, in which the $N^+$ type SiC substrate 1 is not removed from the N type SiC layer 2, is used. Further, the voltage drop of the band offset between the $N^+$ type Si substrate 1 and the SiC N type SiC layer 2 is not generated in the SiC semiconductor device.

Successively, a method for manufacturing the SiC semiconductor device having the vertical type power MOSFET having the above construction is explained with reference to manufacturing process drawings of the SiC semiconductor device shown in FIGS. 2 to 4.

Figure 2A:
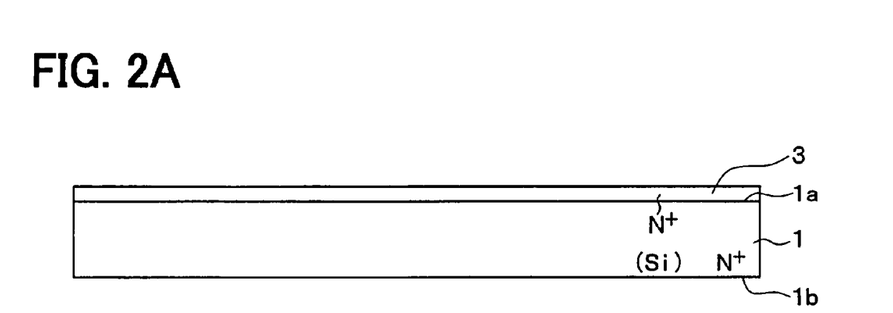
FIGS. 2A to 2C are cross sectional views explaining a manufacturing method of the SiC semiconductor device shown in FIG. 1.

[Step Shown in FIG. 2(a)]

Firstly, the N⁺ type Si substrate 1 having a principal surface 1a of a {111}-surface is prepared. The N⁺ type low resistance SiC layer 3 is epitaxially formed on the principal surface 1a of the N⁺ type Si substrate 1. An N type impurity (e.g., $N_2$) is doped with high concentration in the N⁺ type low resistance SiC layer 3. The concentration is, for example, about $10^{19}$ cm$^{-3}$.

Figure 2B:
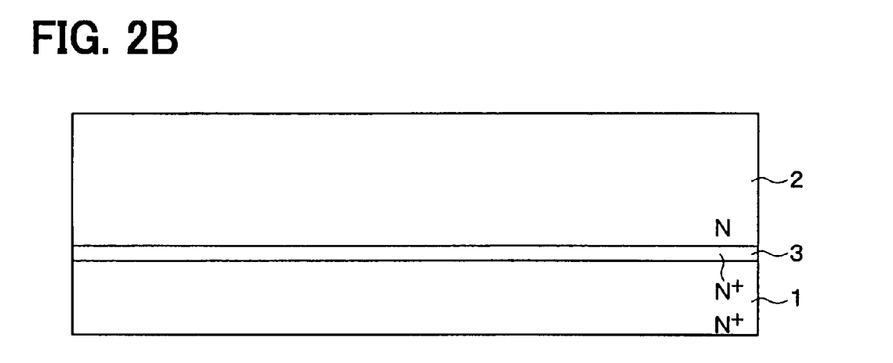

[Step Shown in FIG. 2(b)]

Successively, the N type SiC layer 2 is grown. The N type impurity is doped in the N type SiC layer 2. For example, the N type SiC layer 2 is grown epitaxially with about 10 μm. Thus, the N type SiC layer (2, 3) made of, for example, 3C—SiC is formed on the principal surface 1a of the N⁺ type Si substrate 1. The semiconductor substrate composed of the N⁺ type Si substrate 1 and the N type SiC layer (2, 3) is prepared.

Figure 2C:
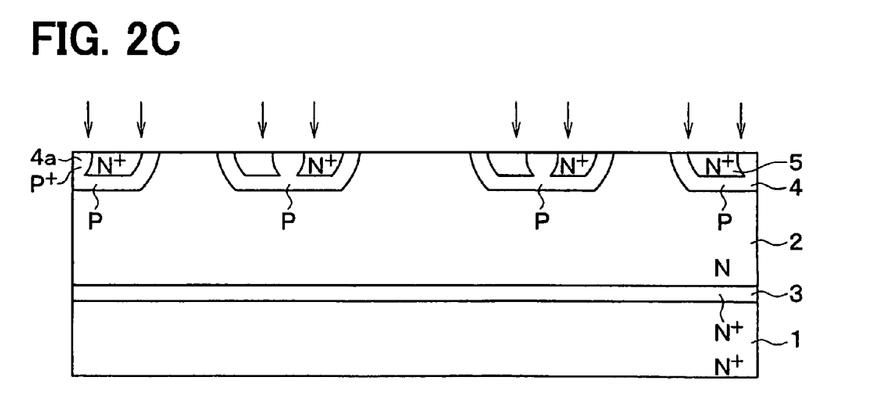

[Step Shown in FIG. 2(c)]

A mask for ion implantation is formed on the surface of the N type SiC layer 2. Then, an opening is formed in the mask on a P type base region 4 to be formed region of the N type SiC layer 2 and the N⁺ type source region 5 to be formed region of the N type SiC layer 2. Successively, a P type impurity is doped through the mask with, for example, an oblique ion implantation. Further, a N type impurity is implanted on the substrate perpendicularly. Then, the mask is removed. Another mask is arranged on the substrate. The other mask has an opening at a contact region 4a to be formed region. Then, an ion implantation is performed on the substrate in a vertical direction, and the ion is activated by a thermal process. Thus, the P type base region 4, the N⁺ type source region 5 and the contact region 4a are formed.

Figure 3A:
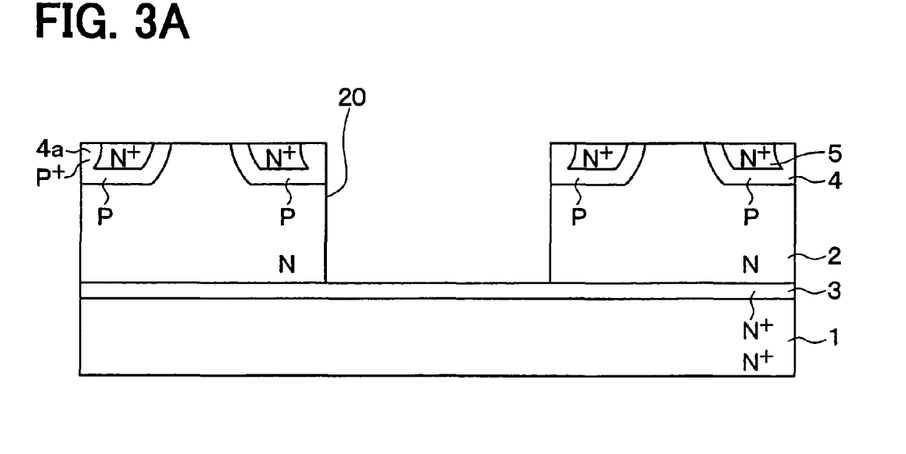
FIGS. 3A to 3C are cross sectional views explaining the manufacturing method of the SiC semiconductor device next to FIG. 2C.

[Step Shown in FIG. 3(a)]

Further another mask is formed on the surface of the N type SiC layer 2. An opening is formed in the further another mask on a trench 10 to be formed region and on a insulation film 12 to be formed region, which are disposed in the N type SiC layer 2. Successively, an anisotropic etching by using the mask is performed, so that a part of the substrate from the surface to the bottom of the N type SiC layer 2 is removed so that a trench 20 reaching the N⁺ type low resistance layer 3 is formed. Then, the mask is removed.

Figure 3B:
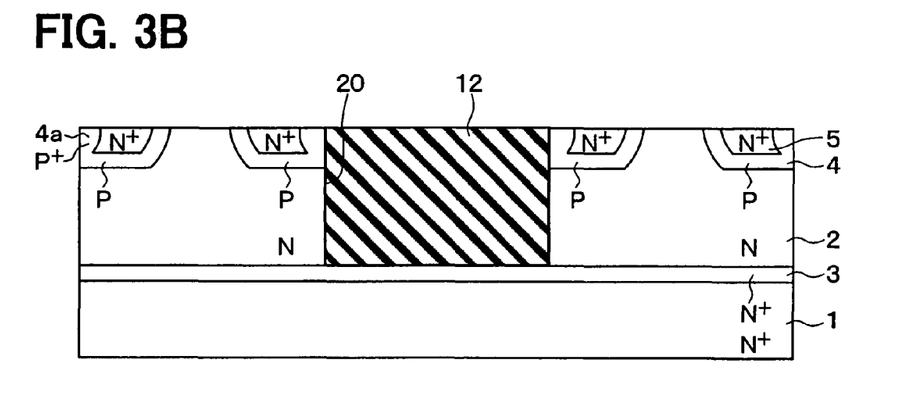

[Step Shown in FIG. 3(b)]

Successively, the insulation film 12 made of, for example, silicon oxide film (i.e., $SiO_2$) is embedded in the trench 20. This step is performed, for example, such that the insulation film 12 is etched back after the insulation film 12 is formed on a whole surface of the N type SiC layer 2 including the inner surface of the trench 20.

Figure 3C:
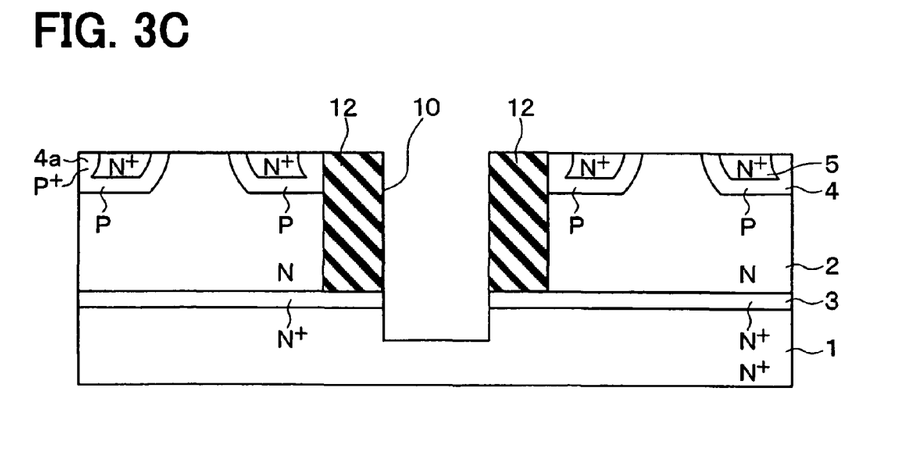

[Step Shown in FIG. 3(c)]

A mask having an opening at a center portion of the trench 20 is arranged, and the anisotropic etching process is performed with using the mask. Specifically, the anisotropic etching is performed such that a trench 10 penetrates the center portion of the insulation film 12 and the N⁺ type low resistance layer 3, and reaches the N⁺ type Si substrate 1. Thus, the trench 10 is formed. Further, a construction that the insulation film 12 remains on the sidewall of the trench 10 is constituted. After that, the mask is removed. Then, if necessary, an anneal process or the like is performed in order to smooth the surface state of the bottom of the trench 10.

Figure 4A:
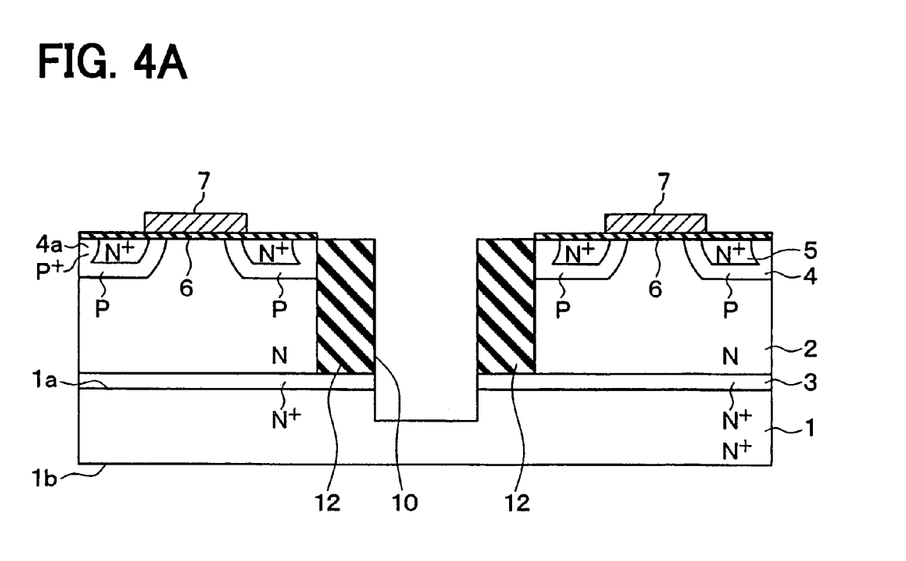
FIGS. 4A and 4B are cross sectional views explaining the manufacturing method of the SiC semiconductor device next to FIG. 3C.

[Step Shown in FIG. 4(a)]

A thermal oxidation process is performed so that the gate oxide film 6 is formed on the surface of the N type SiC layer 2. Then, a doped poly-silicon film or the like is deposited, and then, the doped poly-silicon film is patterned so that the gate electrode 7 is formed.

Figure 4B:
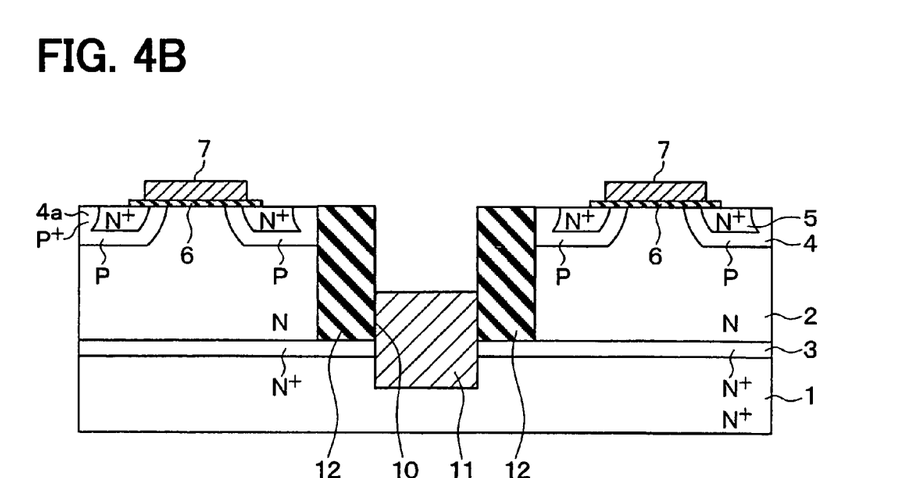

[Step Shown in FIG. 4(b)]

A portion of the gate oxide film 6 is removed. The portion of the gate oxide film 6 is disposed at a predetermined position, for example, at a portion formed on the inner wall of the trench 10. After that, the conductive layer 11 is inserted into the trench 10. For example, the conductive layer 11 made of metal such as aluminum is formed on the surface of the N type SiC layer 2 including the inner wall of the trench 10. Then, the conductive layer is etched back. Thus, the conductive layer 11 is formed such that the conductive layer 11 is disposed on a lower side of the surface of the N type SiC layer 2.

Later steps after the above steps are not shown. However, the interlayer insulation film 8 is formed to cover the surface of the gate electrode 7. Then, a contact hole is formed in the interlayer insulation film 8. Successively, an aluminum layer and the like are formed, and then, the aluminum layer and the like are patterned so that a wiring layer is formed. The wiring layer connects to the source electrode 9 and the gate electrode 7. Then, after a protection film forming step and the like, the SiC semiconductor device having the vertical type power MOSFET shown in FIG. 1 is completed.

As explained above, in the SiC semiconductor device according to this embodiment, the conductive layer 11 made of metal is disposed between the N⁺ type low resistance layer 3 made of SiC and the N⁺ type Si substrate 1 so that the band offset is practically eliminated. Thus, although the semiconductor substrate, in which the N⁺ type SiC substrate 1 is not removed from the N type SiC 2, is used, the SiC semiconductor device can be provided, the device without generating the voltage drop of the band offset between the N⁺ type Si substrate 1 and the SiC N type SiC layer 2.

Second Embodiment

A second embodiment of the present invention is explained as follows. This embodiment is different from the first embodiment with respect to the point that the vertical type power MOSFET to be formed in the SiC semiconductor device is a trench type MOSFET instead of the planar type MOSFET.

Figure 5:
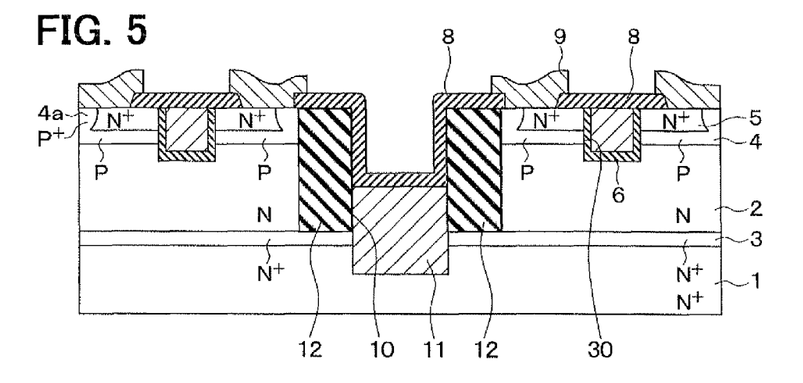
FIG. 5 is a cross sectional view showing a SiC semiconductor device having a N channel trench type vertical power MOSFET according to a second embodiment of the present invention.

FIG. 5 is a cross sectional view showing the SiC semiconductor device according to this embodiment. As shown in this drawing, the P type base region 4 and the N⁺ type source region 5 are formed on a surface portion of the N type SiC layer 2 in this order. The trench 30 is formed such that the trench 30 penetrates the P type base region 4 and the N⁺ type source region 5, and reaches the N type SiC layer 2. The gate oxide film 6 and the gate electrode 7 are formed in the trench 30.

In such construction, the trench 10 is formed between the vertical type power MOSFET. The trench 10 penetrates the N type SiC layer 2 and the N⁺ type low resistance layer 3, and reaches the N⁺ type Si substrate 1. The conductive layer 11 is disposed in the trench 10. Further, a portion of the N type SiC layer 2 to be a sidewall of the trench 10 is provided by the insulation film 12.

Thus, even when an element disposed in the SiC semiconductor device is a trench type vertical power MOSFET, the device may have the same effect as the first embodiment. Here, a manufacturing method of the SiC semiconductor device is basically similar to the method of the first embodiment. However, to provide the gate construction, a mask having an opening at a trench 30 to be formed region is arranged on the surface of the N+ type source region 5 before forming the gate oxide film 6. It is required to form the trench 30 by using this mask. Regarding other steps of the manufacturing method of the device is similar to the first embodiment.

Third Embodiment

A third embodiment of the present invention is explained as follows. Although this embodiment has a different construction different from the first embodiment, this embodiment has the same effect as the first embodiment. Here, a planar type vertical power MOSFET in a SiC semiconductor device according to this embodiment has a basic construction similar to the first embodiment.

Figure 6:
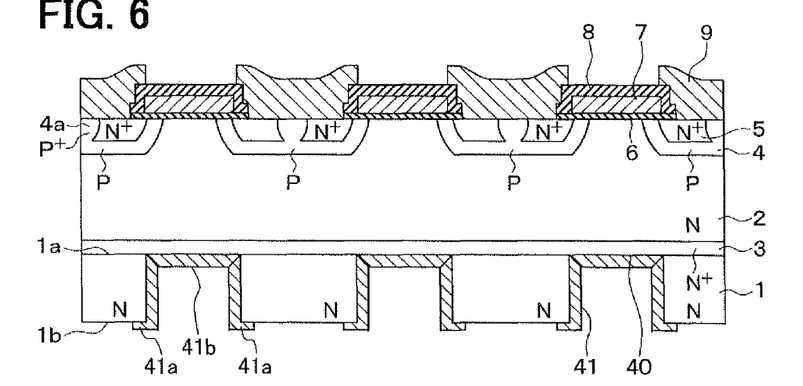
FIG. 6 is a cross sectional view showing a SiC semiconductor device having a N channel planar type vertical power MOSFET according to a third embodiment of the present invention.

FIG. 6 is a cross sectional view showing the SiC semiconductor device according to this embodiment. As shown in FIG. 6, the planar type vertical power MOSFET described in the first embodiment is formed in the N type SiC layer 2. However, the trench 10, the conductive layer 11 and the insulation film 12 described in the first embodiment (Refer to FIG. 1) are not formed in the device in FIG. 6. Alternatively, a trench 40 is formed such that the trench 40 reaches the N+ type low resistance layer 3 from a backside surface 1b of the N+ type Si substrate 1. Further, a backside electrode 41 is formed to cover the inner wall of the trench 40. The backside electrode 41 is made of, for example, aluminum, nickel, copper, a titanium-nickel-gold multi-layer film or the like. Alternatively, the backside electrode 41 is made of different material in each part of the backside electrode 41. For example, a part 41a of the backside electrode 41 disposed on the surface of the N+ type Si substrate 1 is made of aluminum, and another part 41b of the backside electrode 41 disposed on the surface of the N+ type low resistance layer 3 is made of nickel.

In a case of the above construction, when a predetermined voltage is applied to the gate electrode 7 so that the current flows between the source and the drain, the electron passes through the N+ type source region 5, the channel region, and the N type SiC layer 2. Then, the electron directly flows from the N+ type low resistance layer 3 to the backside electrode 41. Then, the electron flows from the backside electrode 41 to an external circuit, or the electron flows from the backside electrode 41 to the external circuit through the N+ type Si substrate 1. Therefore, the current can flow between the source and the drain without exceeding the band offset between the N+ type low resistance layer 3 made of SiC and the N+ type Si substrate 1. Specifically, by inserting the conductive layer 11 made of metal between the N+ type low resistance layer 3 made of SiC and the N+ type Si substrate 1, the band offset is practically eliminated.

Thus, similar to the first embodiment, although the semiconductor substrate, in which the N+ type SiC substrate 1 is not removed from the N type SiC 2, is used, the SiC semiconductor device can be provided, the device without generating the voltage drop of the band offset between the N+ type Si substrate 1 and the SiC N type SiC layer 2.

Here, in a case where the SiC semiconductor device according to this embodiment is manufactured, the steps shown in FIGS. 2(a) to 2(c) described in the first embodiment are performed. Then, the steps after the step shown in FIG. 4(a) are performed without performing the steps shown in FIGS. 3(a) to 3(c) and 4(a). Then, the trench 40 is etched from the backside surface 1b of the N+ type Si substrate 1 by using a mask. After that, the backside electrode 41 is formed.

Fourth Embodiment

A fourth embodiment of the present invention is explained. This embodiment is different from the third embodiment with respect to the point that the vertical type power MOSFET to be formed in the SiC semiconductor device is a trench type MOSFET instead of the planar type MOSFET.

Figure 7:
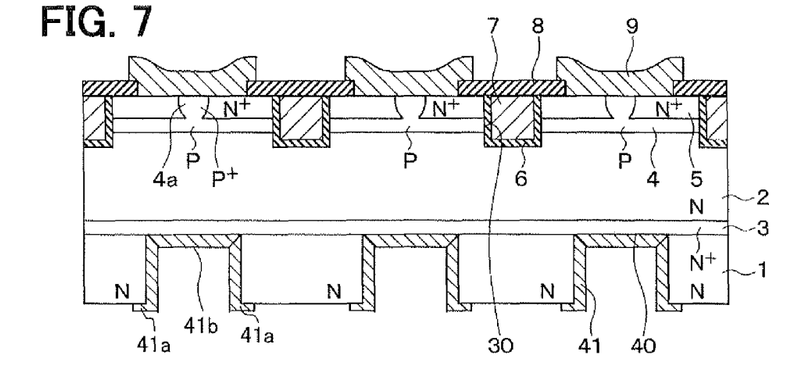
FIG. 7 is a cross sectional view showing a SiC semiconductor device having a N channel trench type vertical power MOSFET according to a fourth embodiment of the present invention.

FIG. 7 is a cross sectional view showing a SiC semiconductor device according to this embodiment. As shown in this drawing, the P type base region 4 and the N+ type source region 5 are formed on the surface portion of the N type SiC layer 2 in this order. The trench 30 is formed such that the trench 30 penetrates the P type base region 4 and the N+ type source region 5, and reaches the N type SiC layer 2. The gate oxide film 6 and the gate electrode 7 are formed in the trench 30.

In the above construction, the trench 40 is formed such that the trench reaches the N+ type low resistance layer 3 from the backside surface 1b of the N+ type Si substrate 1. The backside electrode 41 is formed to cover the inner wall of the trench 40. The backside electrode 41 is made of aluminum, titanium or the like.

Thus, even when an element disposed in the SiC semiconductor device is a trench type vertical power MOSFET, the device can have the same effect as the third embodiment. Here, a manufacturing method of the SiC semiconductor device is basically similar to the method of the third embodiment. However, to provide the trench gate construction, a mask having an opening at a trench 30 to be formed region is arranged on the surface of the N+ type source region 5 before forming the gate oxide film 6. It is required to form the trench 30 by using this mask. Regarding other steps of the manufacturing method of the device is similar to the third embodiment.

Figure 8A:
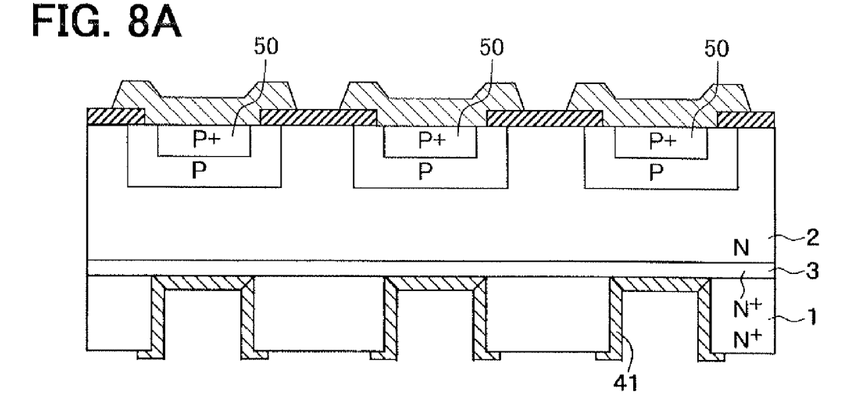
FIG. 8A is a cross sectional view showing a SiC semiconductor device having a PN diode.
Figure 8B:
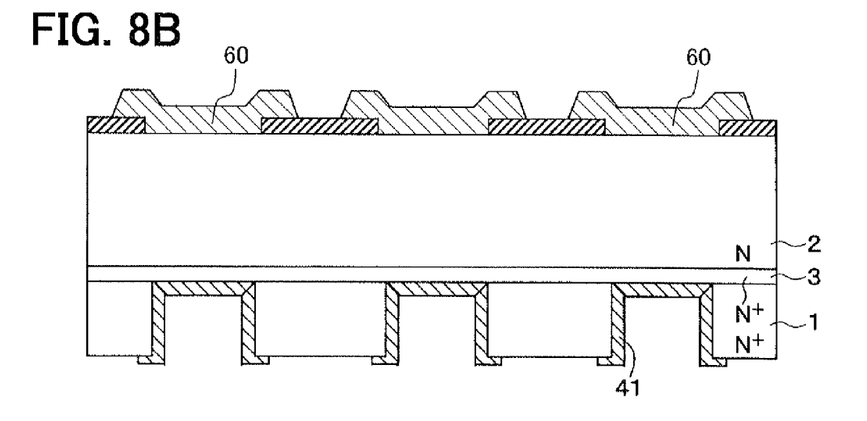
FIG. 8B is a cross sectional view showing a SiC semiconductor device having a Schottky barrier diode.
Figure 8C:
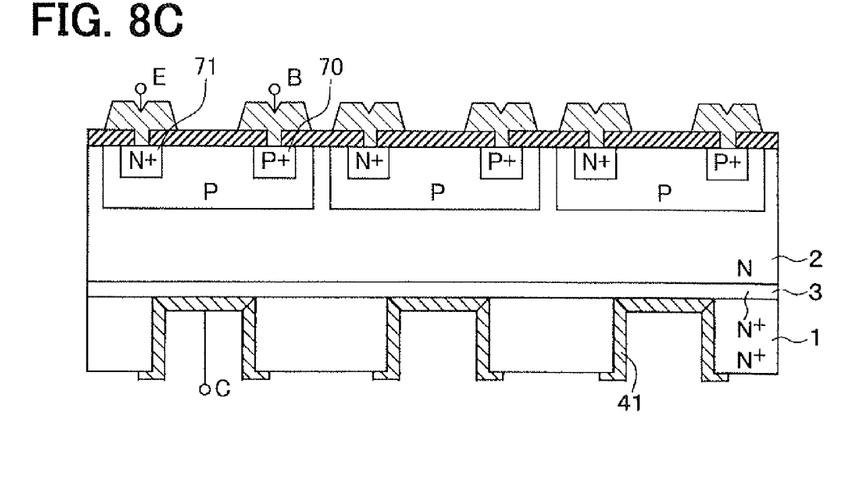
FIG. 8C is a cross sectional view showing a SiC semiconductor device having a bipolar transistor.

Other Embodiments (1) In the first to fourth embodiments, the planar type or the trench type vertical power MOSFET is used as one exemplary embodiment of the present invention. However, these embodiments are merely one example. Therefore, the present invention can be applied to other elements. For example, in a semiconductor device having the N type SiC layer 2 formed on the surface of the N+ type Si substrate 1, the present invention can be applied to a vertical type element having a construction that current flows on both sides of the semiconductor substrate. Referring to FIGS. 8A-8C in which FIG. 8A is a cross sectional view showing a SiC semiconductor device having the PN diode, FIG. 8B is a cross sectional view showing a SiC semiconductor device having the Schottky barrier diode, and FIG. 8C is a cross sectional view showing a SiC semiconductor device having the bipolar transistor, the vertical element is, for example, a PN diode having a P type SiC layer 50 formed on an upper portion of the N type SiC layer 2, a Schottky barrier diode having an electrode 60 contacting the N type SiC layer 2 with Schottky contact, or a bipolar transistor having a base region 70 and an emitter region 71 formed in the N type SiC layer 2.

(2) In the above first embodiment, although it is not specifically described regarding a front view layout of the trench 10, a layout of the trench 10 can be changed variously in accordance with a shape of each cell composed of the vertical type power MOSFET. For example, when each cell of the vertical type power MOSFET has a square shape, the layout of the trench 10 has a square shape for surrounding each cell. When each cell of the vertical type power MOSFET has a stripe shape, the layout of the trench 10 has a stripe shape parallel to each cell. Alternatively, only the trench 10 may be arranged to be a dotted pattern.

(3) The manufacturing method of the SiC semiconductor device described in the first to fourth embodiments is merely exemplary embodiments. The SiC semiconductor device having the same constructions as the first to fourth embodiments can be manufactured by other methods. For example, in the steps shown in FIGS. 3(a) to 3(c), the trench 20 is formed at only a position corresponding to the trench 10, and further, the depth of the trench 20 does not reach the $N^+$ type low resistance layer 3. Then, the inner wall (i.e., the sidewall and the bottom) of the trench 20 is thermally oxidized so that the insulation film 12 is formed. After that, the bottom of the insulation film 12 and the $N^+$ type low resistance layer 3 disposed under the insulation film 12 are etched.

Further, the order of the steps in the manufacturing method of the SiC semiconductor device described in the first to fourth embodiments can be changeable.

(4) In the first to fourth embodiments, the N channel type vertical power MOSFET, in which the first conductive type is the N type, and the second conductive type is the P type, is explained as an example. Alternatively, the present invention may be applied to a P channel type vertical power MOSFET, in which the conductive type in each part is reversed. Further, regarding the above described PN diode, Schottly barrier diode and the bipolar transistor, the conductive type in each part may be reversed.

(5) In the first to fourth embodiments, the inversion type vertical power MOSFET is explained as an example. Alternatively, for example, the vertical type MOSFET may have an accumulation type channel. Here, regarding the vertical type power MOSFET having the accumulation type channel, it is well-known and disclosed in, for example, Japanese Patent No. 3385938 and Japanese Patent Application Publication No. H10-308511. Therefore, the explanation of the detailed construction of the MOSFET having the accumulation type channel is skipped.

(6) In the above each embodiment, the device includes the $N^+$ type low resistance layer 3 so that ohmic contact of the conductive layer 11 or the backside electrode 41 is obtained. In some cases of certain impurity concentration of the N type SiC layer 2, the device may not include the N type low resistance layer. However, when the device does not include the $N^+$ type low resistance layer 3, regarding the first and second embodiments, it is required to have the construction that the conductive layer 11 is connected to both of the N type SiC layer 2 and the $N^+$ type silicon substrate 1 at a boundary between the $N^+$ type silicon substrate 1 and the N type SiC layer 2.

The present invention provides the following aspects.

A silicon carbide semiconductor device includes a semiconductor element. The semiconductor element is disposed in a semiconductor substrate having a first conductive type silicon carbide layer and a silicon substrate. The first conductive type silicon carbide layer is disposed on a principal surface of the silicon substrate. The device includes: a trench disposed on a surface of the silicon carbide layer to reach the silicon substrate; and a conductive layer disposed in the trench at a boundary portion between the silicon carbide layer and the silicon substrate to connect to both of the silicon carbide layer and the silicon substrate. The semiconductor element is a vertical type semiconductor element so that current flows on both of a top surface portion and a backside surface portion of the semiconductor substrate. The current flows through the conductive layer.

Thus, the conductive layer is arranged between the silicon carbide layer and the silicon substrate, so that a band offset is eliminated substantially. Thus, the semiconductor substrate, in which the silicon substrate is not removed from the silicon carbide layer, is used for the silicon carbide semiconductor device without generating the voltage drop of the band offset between the silicon substrate and the silicon carbide layer. The SiC semiconductor device having no voltage drop of the band offset between the Si substrate and the SiC layer without removing the Si substrate is provided.

Alternatively, the silicon carbide semiconductor device may further include a low resistance layer disposed at a boundary portion between the silicon carbide layer and the silicon substrate in such a manner that an impurity concentration of a first conductive type impurity in the low resistance layer is higher than that of the silicon carbide layer. The trench penetrates the low resistance layer and reaches the silicon substrate, and the conductive layer is disposed in the trench to connect between the low resistance layer and the silicon substrate.

Thus, the low resistance layer is arranged so that the internal resistance of the low resistance layer does not participate in the voltage drop. Further, it is possible to contact the conductive layer easily with ohmic contact.

Alternatively, the silicon carbide semiconductor device may further include an insulation film disposed on a sidewall of the trench. Thus, by forming the insulation film, the conductive layer can be insulated and separated from the semiconductor element.

Alternatively, the semiconductor element may be a bipolar transistor having a base region and an emitter region disposed in the silicon carbide layer. The base region has a second conductive type, and the emitter region has the first conductive type. Alternatively, the semiconductor element may be a PN diode provided by a second conductive type layer in the silicon carbide layer. Alternatively, the semiconductor element may be a Schottky barrier diode provided by a metallic layer on a surface of the silicon carbide layer, and the metallic layer contacts the surface of the silicon carbide layer with Schottky contact.

Alternatively, the semiconductor element is a vertical type power MOSFET including: a base region having a second conductive type, which is disposed on a surface portion of the silicon carbide layer; a source region having the first conductive type, which is disposed on a surface portion of the base region; a gate insulation film disposed on a channel region, which is provided by a portion of the surface of the base region, the portion sandwiched between the silicon carbide layer and the source region; a gate electrode disposed on the gate insulation film; an interlayer insulation film for covering the gate electrode, wherein a contact hole is disposed in the interlayer insulation film for connecting to both of the source region and the base region; and a source electrode for electrically connecting to both of the source region and the base region through the contact hole in the interlayer insulation film. Further, the vertical type power MOSFET may be a planar type vertical power MOSFET, in which the channel region is parallel to the principal surface of the silicon substrate. Further, the vertical type power MOSFET may be a trench type vertical power MOSFET having a second trench. The second trench is disposed on the surface of the silicon carbide layer. The gate insulation film and the gate electrode are disposed on the sidewall of the second trench. The source region and the base region contact the sidewall of the second trench. The channel region is disposed on the sidewall of the second trench.

The above vertical type power MOSFET is, for example, a planar type MOSFET or a trench type MOSFET. The MOSFET may have no preference between the planar type and the trench type. In the planar type MOSFET, the channel region is parallel to the principal surface of the silicon substrate. The trench type MOSFET is constructed such that a trench is formed on the surface of the silicon carbide layer; the gate insulation film and the gate electrode are formed on the sidewall of the trench; the source region and the base region are formed to contact the sidewall of the trench; and the channel region is disposed on the sidewall of the trench.

Alternatively, a part of the conductive layer may be made of titanium, the part contacting the silicon substrate, and another part of the conductive layer may be made of nickel, the other part contacting the silicon carbide layer.

Further, a silicon carbide semiconductor device includes a semiconductor element. The semiconductor element is disposed in a semiconductor substrate having a first conductive type silicon carbide layer and a silicon substrate. The first conductive type silicon carbide layer is disposed on a principal surface of the silicon substrate. The device includes: a trench disposed on a backside surface of the silicon substrate to reach the silicon carbide layer; and a backside electrode disposed in the trench at a boundary portion between the silicon carbide layer and the silicon substrate to connect to both of the silicon carbide layer and the silicon substrate. The semiconductor element is a vertical type semiconductor element so that current flows on both of a foreside surface portion and a backside surface portion of the semiconductor substrate. The current flows through the backside electrode.

Thus, even when the trench is formed on the backside surface of the silicon substrate to reach the silicon carbide layer, and the backside electrode is formed in the trench, the device can attain the following effects. Specifically, the backside electrode is arranged between the silicon carbide layer and the silicon substrate, so that a band offset is eliminated substantially. Thus, the semiconductor substrate, in which the silicon substrate is not removed from the silicon carbide layer, is used for the silicon carbide semiconductor device without generating the voltage drop of the band offset between the silicon substrate and the silicon carbide layer. The SiC semiconductor device having no voltage drop of the band offset between the Si substrate and the SiC layer without removing the Si substrate is provided.

Alternatively, the silicon carbide semiconductor device may further include a low resistance layer disposed at a boundary portion between the silicon carbide layer and the silicon substrate in such a manner that an impurity concentration of a first conductive type impurity in the low resistance layer is higher than that of the silicon carbide layer. The trench reaches the low resistance layer. The backside electrode is disposed in the trench to connect between the low resistance layer and the silicon substrate.

As defined in the above device, a low resistance layer is formed at a boundary portion between the silicon carbide layer and the silicon substrate in such a manner that an impurity concentration of the first conductive type impurity in the silicon carbide layer is partially increased. The backside is formed in the trench to connect between the low resistance layer and the silicon substrate. In the above case, the device can attain the following effects. Specifically, the low resistance layer is arranged so that the internal resistance of the low resistance layer does not participate in the voltage drop. Further, it is possible to contact the backside electrode easily with ohmic contact.

Alternatively, a part of the backside electrode may be made of titanium, the part contacting the silicon substrate, and another part of the backside electrode may be made of nickel, the other part contacting the silicon carbide layer. In this case, the backside electrode can contact both of the silicon substrate and the silicon carbide layer with ohmic contact.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A silicon carbide semiconductor device including a semiconductor element, wherein the semiconductor element is disposed in a semiconductor substrate having a first conductive type silicon carbide layer and a silicon substrate, and wherein the first conductive type silicon carbide layer is disposed on a principal surface of the silicon substrate, the device comprising:
    a trench disposed on a backside surface of the silicon substrate to reach the silicon carbide layer; and
    a backside electrode disposed in the trench at a boundary portion between the silicon carbide layer and the silicon substrate to connect to both of the silicon carbide layer and the silicon substrate, wherein
    the semiconductor element is a vertical type semiconductor element so that current flows on both of a front side surface portion and a backside surface portion of the semiconductor substrate, and
    the current flows through the backside electrode.

2. The silicon carbide semiconductor device according to claim 1, further comprising:
    a low resistance layer disposed at a boundary portion between the silicon carbide layer and the silicon substrate in such a manner that an impurity concentration of a first conductive type impurity in the low resistance layer is higher than that of the silicon carbide layer, wherein
    the trench reaches the low resistance layer, and
    the backside electrode is disposed in the trench to connect between the low resistance layer and the silicon substrate.

3. The silicon carbide semiconductor device according to claim 1, wherein
    a part of the backside electrode is made of titanium, the part contacting the silicon substrate, and
    another part of the backside electrode is made of nickel, the other part contacting the silicon carbide layer.

4. The silicon carbide semiconductor device according to claim 1, wherein
    the semiconductor element is a bipolar transistor having a base region and an emitter region disposed in the silicon carbide layer,
    the base region has a second conductive type, and
    the emitter region has the first conductive type.

5. The silicon carbide semiconductor device according to claim 1, wherein
    the semiconductor element is a PN diode provided by a second conductive type layer in the silicon carbide layer.

6. The silicon carbide semiconductor device according to claim 1, wherein
the semiconductor element is a Schottky barrier diode provided by a metallic layer on a surface of the silicon carbide layer, and
the metallic layer contacts the surface of the silicon carbide layer with Schottky contact.

7. The silicon carbide semiconductor device according to claim 1, wherein
the semiconductor element is a vertical type power MOSFET including:
a base region having a second conductive type, which is disposed on a surface portion of the silicon carbide layer;
a source region having the first conductive type, which is disposed on a surface portion of the base region;
a gate insulation film disposed on a channel region, which is provided by a portion of the surface of the base region, the portion sandwiched between the silicon carbide layer and the source region;
a gate electrode disposed on the gate insulation film;
an interlayer insulation film for covering the gate electrode, wherein a contact hole is disposed in the interlayer insulation film for connecting to both of the source region and the base region; and
a source electrode for electrically connecting to both of the source region and the base region through the contact hole in the interlayer insulation film.

8. The silicon carbide semiconductor device according to claim 7, wherein
the vertical type power MOSFET is a planar type vertical power MOSFET, in which the channel region is parallel to the principal surface of the silicon substrate.

9. The silicon carbide semiconductor device according to claim 7, wherein
the vertical type power MOSFET is a trench type vertical power MOSFET having a second trench,
the second trench is disposed on the surface of the silicon carbide layer,
the gate insulation film and the gate electrode are disposed on a sidewall of the second trench,
the source region and the base region contact the sidewall of the second trench, and
the channel region is disposed on the sidewall of the second trench.

* * * * *